US010624234B2

(12) United States Patent
Saido

(10) Patent No.: US 10,624,234 B2
(45) Date of Patent: Apr. 14, 2020

(54) HOUSING AND COOLING STRUCTURE INCLUDING PARTITION PROVIDING DEDICATED AIRFLOW SPACE

(71) Applicant: FANUC CORPORATION, Yamanashi (JP)

(72) Inventor: Norihiro Saido, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/171,959

(22) Filed: Oct. 26, 2018

(65) Prior Publication Data

US 2019/0133000 A1 May 2, 2019

(30) Foreign Application Priority Data

Oct. 31, 2017 (JP) ................................ 2017-210451

(51) Int. Cl.
*H05K 7/20* (2006.01)
*G02F 1/1333* (2006.01)

(52) U.S. Cl.
CPC ... *H05K 7/20163* (2013.01); *G02F 1/133385* (2013.01); *H05K 7/20154* (2013.01); *H05K 7/20172* (2013.01); *H05K 7/20972* (2013.01)

(58) Field of Classification Search
CPC .......................... H05K 7/20136–20163; H05K 7/20954–2099; G06F 1/20
USPC .................. 361/695–697, 679.48–679.51
See application file for complete search history.

(56) References Cited

U.S. PATENT DOCUMENTS

| 6,833,674 | B2 * | 12/2004 | Kaneko | H05K 7/20972 |
| | | | | 313/11 |
| 8,289,715 | B2 * | 10/2012 | Takahara | H05K 7/2099 |
| | | | | 348/836 |
| 2017/0003544 | A1 | 1/2017 | Yasuda | |
| 2019/0070328 | A1 * | 3/2019 | Yang | A61L 9/032 |

FOREIGN PATENT DOCUMENTS

| JP | 5928284 U | 2/1984 |
| JP | 934374 A | 2/1997 |
| JP | 2003173147 A | 6/2003 |
| JP | 200748946 A | 2/2007 |
| JP | 200752951 A | 3/2007 |
| JP | 2010130779 A | 6/2010 |
| JP | 2010205826 A | 9/2010 |
| JP | 2012222112 A | 11/2012 |
| JP | 2015138257 A | 7/2015 |
| JP | 201715911 A | 1/2017 |

OTHER PUBLICATIONS

English Abstract for Japanese Publication No. 2017015911 A, published Jan. 19, 2017, 2 pgs.

(Continued)

*Primary Examiner* — Zachary Pape
(74) *Attorney, Agent, or Firm* — Fredrikson & Byron, P.A.

(57) ABSTRACT

A cooling structure includes a housing, a fan for cooling the interior of the housing by generating air flow inside the housing, and a partition provided in the housing to divide the interior of the housing into a first space and a second space. The air flow containing oil mist is taken in from the outside and passed through the first space by driving the fan.

5 Claims, 4 Drawing Sheets

(56) References Cited

OTHER PUBLICATIONS

English Abstract and Machine Translation for Japanese Publication No. 2015-138257 A, published Jul. 30, 2015, 6 pgs.
English Abstract and Machine Translation for Japanese Publication No. 2012-222112 A, published Nov. 12, 2012, 8 pgs.
English Abstract and Machine Translation for Japanese Publication No. 2007-052951 A, published Mar. 1, 2007, 9 pgs.
English Abstract and Machine Translation for Japanese Publication No. 2003-173147 A, published Jun. 20, 2003, 9 pgs.
English Abstract and Machine Translation for Japanese Publication No. 2010-205826 A, published Sep. 16, 2010, 7 pgs.
English Abstract and Machine Translation for Japanese Publication No. 2010-130779 A, published Jun. 10, 2010, 5 pgs.
English Machine Translation for Japanese Publication No. S59-028284 U, published Feb. 22, 1984, 3 pgs.
English Abstract and Machine Translation for Japanese Publication No. 2007-048946 A, published Feb. 22, 2007, 7 pgs.
English Abstract and Machine Translation for Japanese Publication No. H09-034374 A, published Feb. 7, 1997, 9 pgs.

\* cited by examiner

HOUSING AND COOLING STRUCTURE INCLUDING PARTITION PROVIDING DEDICATED AIRFLOW SPACE

CROSS-REFERENCE TO RELATED APPLICATION

This application is based upon and claims the benefit of priority from Japanese Patent Application No. 2017-210451 filed on Oct. 31, 2017, the contents of which are incorporated herein by reference.

BACKGROUND OF THE INVENTION

Field of the Invention

The present invention relates to a cooling structure for cooling the interior of a housing by flowing air current in the housing by driving a fan as well as relating the housing in which the interior is cooled by airflow generated by the fan.

Description of the Related Art

Japanese Laid-Open Patent Publication No. 2015-138257 discloses a system for cooling a printed circuit board (electronic components) which is disposed behind a display device and is cooled by airflow generated by a fan, in a hermetically sealed (or enclosed) control console.

SUMMARY OF THE INVENTION

In order to efficiently cool electronic components disposed in a housing, it is desirable to take in outside air and cool the electronic components. However, when the housing is disposed under an environment where oil mist exists, if the outside air including the oil mist is taken into the housing to cool the electronic components, there is a risk that the electronic components are affected by the oil mist.

It is therefore an object of the present invention to provide a cooling structure and a housing capable of efficiently cooling electronic components while suppressing the influence of oil mist.

A first aspect of the present invention resides in a cooling structure including a housing, and a fan configured to cool interior of the housing by generating air flow inside the housing, the cooling structure including a partition provided in the housing and configured to divide the interior of the housing into a first space and a second space, wherein the air flow containing oil mist is taken in from outside and passed through the first space, by driving the fan.

A second aspect of the present invention resides in a housing whose interior is cooled by air flow generated by a fan, comprising a partition provided in the housing and configured to divide the interior of the housing into a first space and a second space, wherein the air flow containing oil mist is taken in from outside and passed through the first space, by driving the fan.

According to the present invention, it is possible to efficiently cool electronic components while suppressing the influence of oil mist.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A preferred embodiment of a cooling structure and a housing according to the present invention will be described in detail hereinbelow with reference to the accompanying drawings.

[Outline of Controller 12 and Display Device 14]

Figure 1:
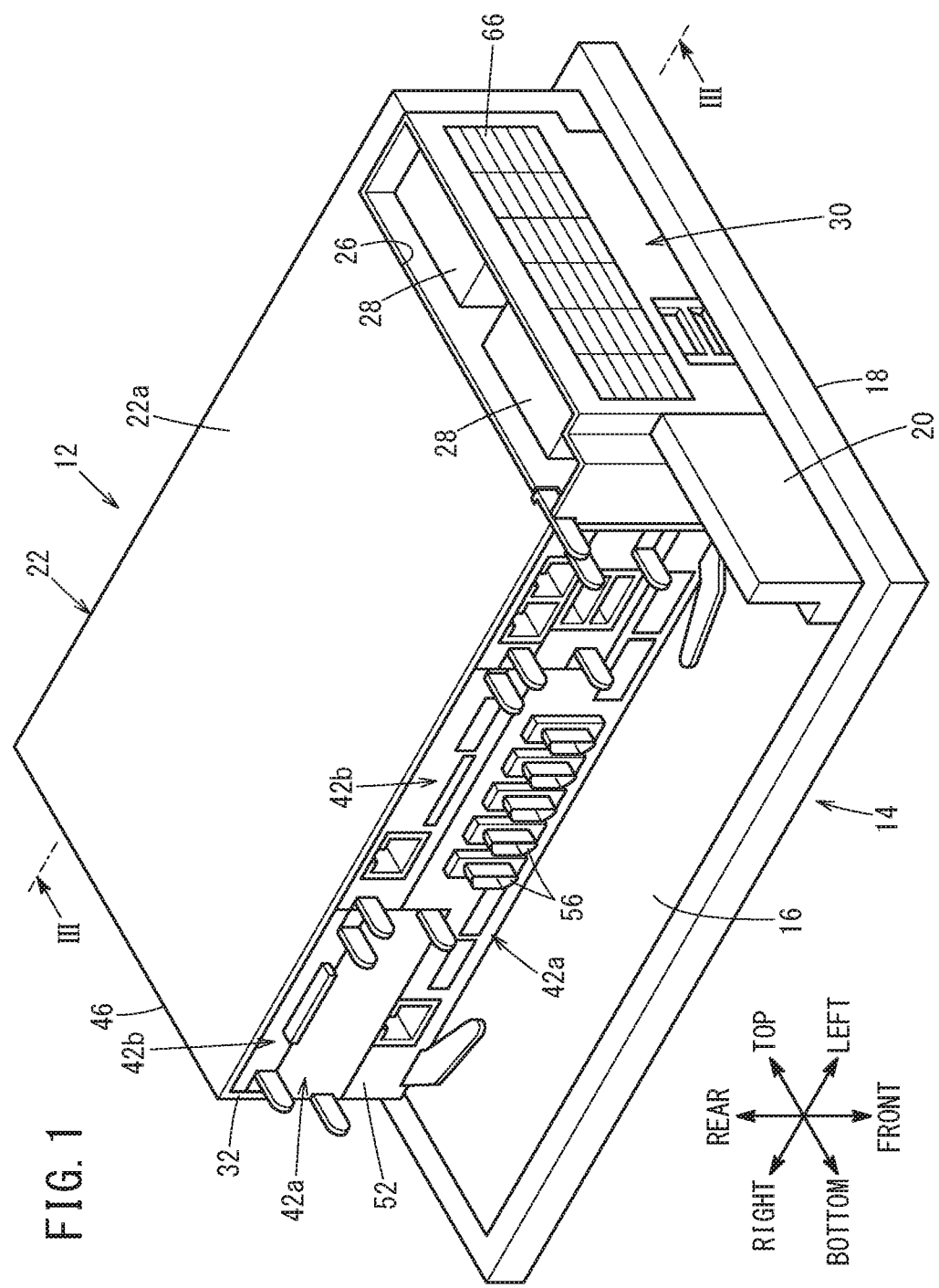
FIG. 1 is a perspective view illustrating a state where a controller having a cooling structure and a housing according to the present embodiment applied thereto is mounted on the rear face of a display device.
Figure 2:
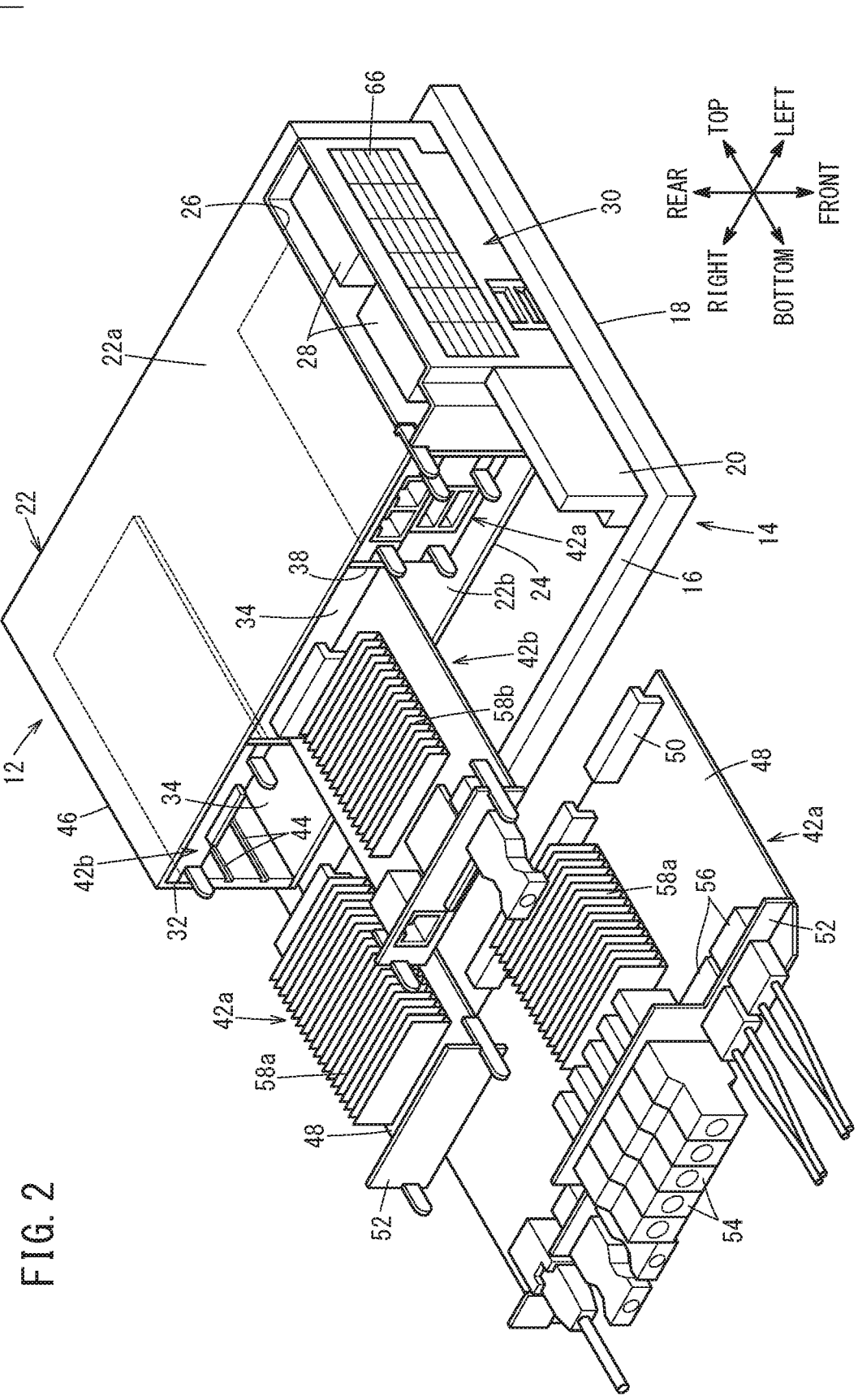
FIG. 2 is a perspective view illustrating insertion and removal of control boards relative to slots of the housing of FIG. 1.
Figure 3:
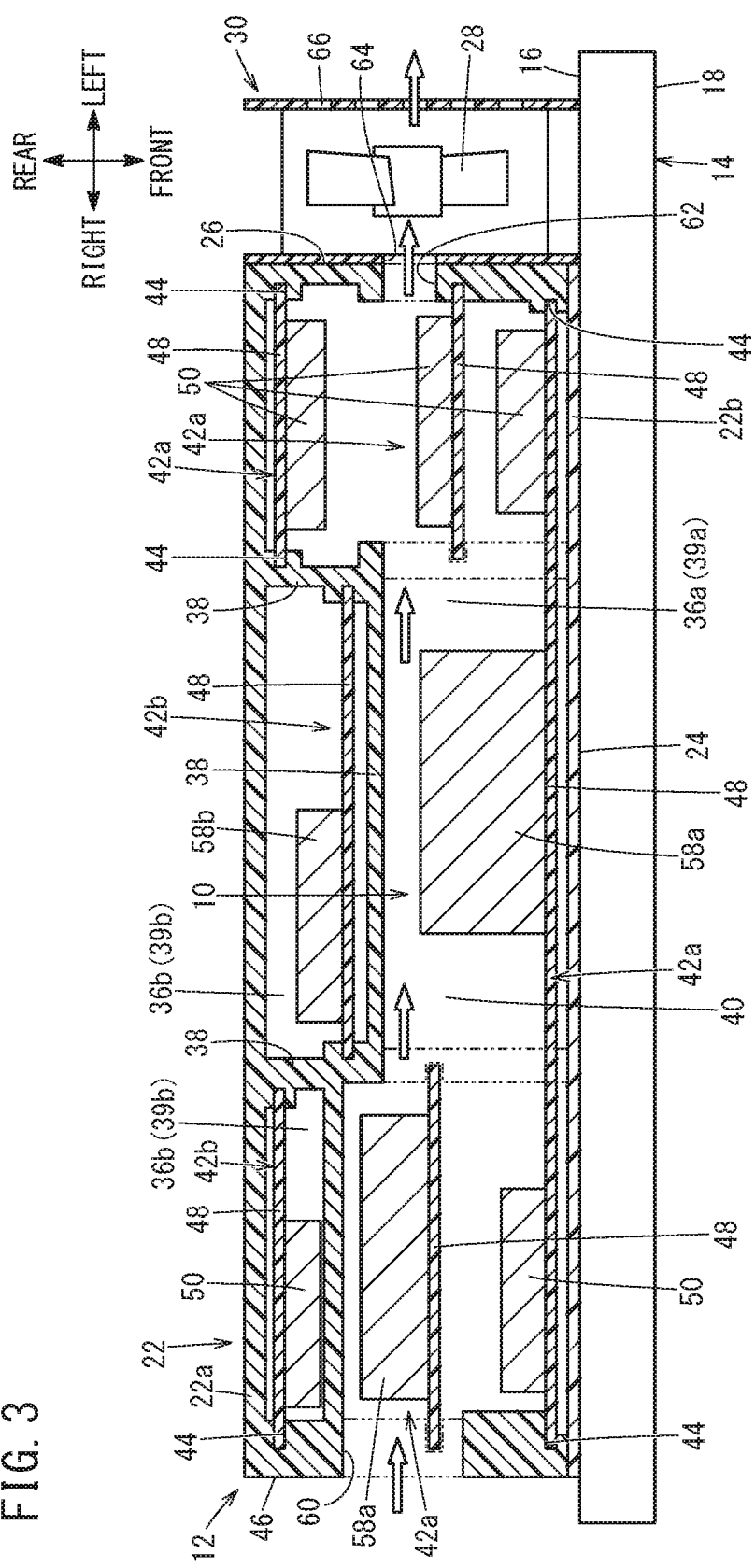
FIG. 3 is a sectional view taken along line III-III in FIG. 1.

A cooling structure 10 and a housing 22 of the present embodiment are applied to a controller 12 shown in FIGS. 1 to 3. The controller 12 is arranged on a back face 16 of a display device 14. Here, the configurations of the controller 12 and the display device 14 will be described first, then the cooling structure 10 (see FIG. 3) and the housing 22 (see FIGS. 1 to 3) will be described.

The controller 12 is a control device for controlling the display device 14. The display device 14 is a liquid crystal display unit having an unillustrated display screen arranged on a front face 18. The controller 12 is applied to, for example, a numerical control device of a CNC (computer numerical control) machine tool. In this case, the display device 14 is provided for the operation panel of the machine tool. In the following description, the directions of up and down, right and left, and front and rear are referred to in accordance with those viewed from the front of the front face 18 of the display device 14.

As shown in FIGS. 1 and 2, the controller 12 and a user interface unit 20 are attached on the back face 16, opposite to the front face 18 of the display device 14. The user interface unit 20 is connectable to unillustrated external devices in a detachable manner. In this case, the controller 12 is detachably attached to the upper side of the back face 16 of the display device 14. On the other hand, the user interface unit 20 is detachably attached to the lower corner portion on the back face 16 of the display device 14. Therefore, the aftermentioned cooling structure 10 (see FIG. 3) can be applied to both the state where the controller 12 is disposed on the back face 16 of the display device 14 and the state where the controller 12 is separated from the display device 14.

The controller 12 has a box-shaped housing 22 attached to the back face 16 of the display device 14. A bottom face 24 (see FIGS. 2 and 3) of the housing 22 opposes the back face 16 of the display device 14. In this case, a fan unit 30 that accommodates two fans 28 to cool the interior of the housing 22 is detachably attached on one side face 26 (the side extending in the vertical direction of the display device 14), which is located closest to the user interface unit 20 among the side faces adjacent to the bottom face 24 of the housing 22. It is sufficient that the fan unit 30 accommodates at least one fan 28 therein.

[Configuration of Controller 12 with Housing 22]

The housing 22 of the controller 12 is composed of a box-shaped casing body 22a having an opening on the front side of the housing 22 (on the back face 16 side of the display device 14), a bottom plate 22b (FIGS. 2 and 3) closing the opening of the casing body 22a). In this case, the side of the bottom plate 22b opposing the back face 16 forms the bottom face 24. In the housing 22 (the casing body 22a), among the side faces adjacent to the bottom face 24, the lower side face (lower face 32) adjacent to the side face 26 to which the fan unit 30 is attached is formed with a plurality of openings 34 of different shapes or sizes.

Formed inside the housing 22 are a plurality of slots 36a, 36b extending from the openings 34 in the vertical direction parallel to the side face 26 to which the fan unit 30 is attached. That is, in the housing 22, a plurality of partitions 38 extending in the front-rear direction and the left-right direction are provided as shown in a sectional view of FIG. 3. As a result, the interior of the housing 22 is divided into a plurality of spaces by the plurality of partitions 38. FIG. 3 shows a case where the interior of the housing 22 is divided into a large first space (first space) 39a formed in the left-right direction of FIG. 3 and two small second spaces (second spaces) 39b formed in the left and the center on the rear side of the housing 22 (the upper side of FIG. 3). The partitions 38 may be part of the housing 22 (casing body 22a) or may be members separated from the housing 22.

As described above, the interior of the housing 22 is divided into the first space 39a and the second spaces 39b, whereby a plurality of slots 36a, 36b extending in the vertical direction are formed so as to have the openings 34 on the lower face 32 side thereof. As a result, all the slots 36a, 36b are provided on the lower face 32 of the housing 22. In the following description, the first space 39a will be referred to as the slot 36a and the second space 39b will be referred to as the slot 36b. Accordingly, the slots 36a, 36b constitute part of the partitions 38.

As shown in FIG. 2 and FIG. 3, a plurality of control boards (electronic components) 42a, 42b for controlling the display device 14 are accommodated in the plural slots 36a, 36b in a removable manner. In the slot 36a, a control board (first electronic component) 42a is stored such that the control board is insertable into and removable from the slot 36a. In each of the plurality of slots 36b, a control board (second electronic component) 42b is stored such that control board 42b is insertable into and removable from the slot 36a.

Also, since the shapes or sizes of the plural slots 36a, 36b (the opening 34) are different from each other, each of the plural control boards 42a, 42b is shaped or sized so as to match the shape or size of the corresponding opening 34, so that the control boards 42a, 42b are inserted into the associated slots 36a, 36b. Guide portions 44 are provided on the left and right sides of each of the slots 36a, 36b inside the housing 22. Specifically, the guide portions 44 are guide rails extended in the vertical direction, and formed on the surfaces of the partition 38, and on the side portions of the housing 22 forming the left side face 26 and right side face 46 of the casing body 22a.

The plural control boards 42a, 42b are inserted into the slots 36a, 36b, respectively, and guided to the interior side of the housing 22 in the vertical direction along the left and right guide portions 44. Use of the guide portions 44 makes it unnecessary to position the control boards 42a, 42b with respect to the front-rear direction and the right-left direction when they are inserted into the slots 36a, 36b.

The plural control boards 42a, 42b each include a substrate 48 extending in the vertical direction and guided by the left and right guide portions 44 of the slots 36a, 36b, a connector 50 provided on the interior side with respect to the direction of insertion (vertical direction) of the substrate 48 and a cover 52 arranged on the opposite side of the connector 50 on the substrate 48. When the control boards 42a, 42b are inserted into the associated slots 36a, 36b, the cover 52 abuts the lower face 32 of the housing 22 to close the opening 34. Thus, formation of the control boards 42a, 42b into units in this way, facilitates the control boards 42a, 42b to be packaged and transported and also makes it easy to take electrostatic countermeasures for the control boards 42a, 42b.

In this case, each of the plural control boards 42a, 42b may further include a connector 56 exposed to the outside through the cover 52 and connected to an external connector 54 and/or a radiator 58a or 58b mounted on the substrate 48 for radiating heat generated in the control board 42a or 42b. Here, the radiator disposed on the control board 42a is referred to as the radiator 58a, and the radiator disposed on the control board 42b is referred to as the radiator 58b.

Here, when the substrates 48 are inserted into the slots 36a, 36b for the plural control boards 42a, 42b, respectively, the inserted substrates 48 can be slid to the interior side in the housing 22 along the left and right side guide portions 44. In this instance, by connecting the connectors 50 with unillustrated connectors on the display device 14 side, the control boards 42a, 42b are electrically connected to the display device 14. Further, by connecting the connectors 50 with unillustrated connectors on the fan unit 30 side, the control boards 42a, 42b are electrically connected to the fan unit 30 (the two fans 28). Further, as the control boards 42a, 42b are moved to the interior side in the housing 22, the covers 52 abut the lower face 32 of the housing 22 to close the openings 34 of the slots 36a, 36b.

On the other hand, when the cover 52 of each of the control boards 42a, 42b that have been inserted in the slots 36a, 36b is pulled downward, the connector 50 is separated from the unillustrated connector so that the control boards 42a, 42b can be pulled out from the slots 36a, 36b along the left and right guide portions 44.

In this manner, the control boards 42a, 42b are inserted into and removed from the slots 36a, 36b, such that it is possible to electrically connect the control boards 42a, 42b with the display device 14 and the fan unit 30, or releasing the connected states. In addition, since each of the control boards 42a, 42b can be easily replaced by a single insertion and removal operation with each of the slots 36a, 36b, maintainability and maintenance performance of the control boards 42a, 42b can be improved.

Further, all the slots 36a, 36b are formed on the lower face 32 of the housing 22 so as to extend in the vertical direction parallel to the back face 16 of the display device 14. As a result, all the control boards 42a, 42b can be easily inserted and removed without interfering with the display device 14.

[Configuration of Cooling Structure 10]

Next, the cooling structure 10 of the present embodiment will be described with reference to FIGS. 1 to 3.

The cooling structure 10 includes the housing 22, the partitions 38 and fans 28 that cool the interior of the housing 22 by generating air flow in the housing 22.

As shown in FIG. 3, the first space 39a (the slot 36a) is defined by the partition 38 provided in the housing 22 so as to penetrate through the housing 22 in the lateral (right-left) direction. In this case, a vent hole 60 for creating communication between the outside and the slot 36a is formed in the right side portion of the casing body 22a forming the side face 46 of the housing 22. A vent hole 62 for creating communication between the slot 36a and the fan unit 30 is formed in the left side portion of the casing body 22a forming the side face 26 of the housing 22. A vent hole 64 connected to the vent hole 62 is formed in the right side portion of the fan unit 30 while a grating 66 is formed in the left side portion of the fan unit 30. Thus, the vent hole 60, the slot 36a, and the vent holes 62, 64 form a duct 40 connected to the fan unit 30 in the first space 39a. As will be described later, in the present embodiment, as long as the control board 42a disposed in the first space 39a can be actively cooled by the air flow containing oil mist, the first space 39a does not necessarily include the structure of the duct 40.

Figure 4:
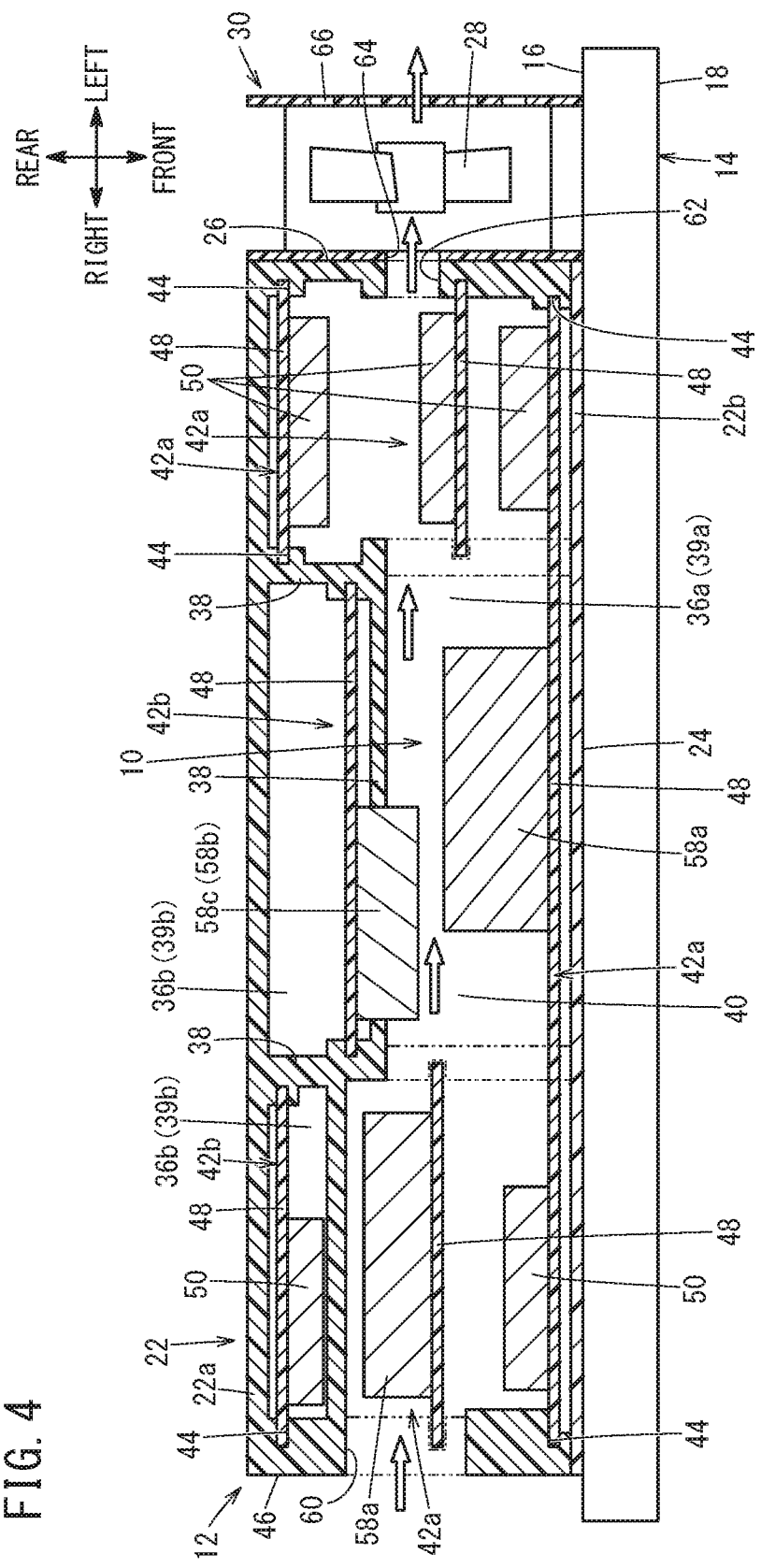
FIG. 4 is a sectional view illustrating a variational example of FIG. 3.

Further, instead of the arrangement of FIG. 3, the cooling structure 10 can adopt a variational example of FIG. 4. In the variational example of FIG. 4, instead of the radiator 58b of the control board 42b housed in the slot 36b, a radiator 58c that is penetrated through the partition 38 and exposed to the first space 39a. In this case, it is preferable that the boundary between the partition 38 and the radiator 58c is sealed with an unillustrated seal so that the aftermentioned air flow containing oil mist will not enter the slot 36b.

Next, the operation of the cooling structure 10 and the housing 22 of the present embodiment will be described. Here, description will be made on a case where the controller 12 (housing 22) with the cooling structure 10 applied thereto is attached to the back face 16 of the display device 14 and the controller 12 and the display device 14 are exposed under an environment containing oil mist.

When the two fans 28 are driven, air flows from the vent hole 60 on the upstream side toward the two fans 28 on the downstream side, as indicated by arrows in FIG. 3. In this case, external air (air flow) containing oil mist is taken into the first space 39a (slot 36a) through the vent hole 60. The air containing oil mist flows in the direction of the arrows in FIG. 3 inside the first space 39a and is discharged to the outside from the grating 66 through the fan unit 30.

In the first space 39a (the slot 36a), a plurality of control boards 42a are accommodated. Each of the control boards 42a is an electronic component that is not easily affected by oil mist and generates a relatively large amount of heat. As a result, each control board 42a is cooled by the air flow containing oil mist. In this case, the first space 39a forms the duct 40. As a result, air can flow at an increased speed so that each control board 42a can be efficiently cooled. In addition, some of the control boards 42a are equipped with radiators 58a. As a result, the heat generated in the radiator-equipped control board 42a is released through the radiator 58a, so that the control board 42a can be cooled more efficiently.

On the other hand, control boards 42b are housed in the second spaces 39b (slots 36b) isolated from the first space 39a by the partitions 38. The control board 42b is an electronic component that is susceptible to oil mist or an electronic component that generates a relatively small amount of heat and does not need active cooling. In this case, the heat generated from the control board 42b is radiated into the first space 39a via the partition 38. That is, the control board 42b is indirectly cooled by the air flow containing oil mist via the partition 38. This makes it possible to cool the control board 42b while avoiding the influence of oil mist.

In this manner, the interior of the housing 22 is divided into the first space 39a and the second spaces 39b by the partitions 38 so that the control board 42a that needs active cooling by the airflow containing oil mist is accommodated in the first space 39a while the control boards 42b that do not need active cooling with air flow containing oil mist is stored in the second spaces 39b. Therefore, in the cooling structure 10, by suppressing the influence of oil mist on the control boards 42a, 42b in a limited manner, that is, by preventing oil mist from affecting on the control boards 42b outside the first space 39a, it is possible to efficiently cool all the control boards 42a, 42b housed in the housing 22.

On the other hand, for an electronic component (control board 42b) that is susceptible to oil mist and generates a large amount of heat, part of the radiator 58c arranged on the control board 42b may be exposed to the first space 39a, as shown in FIG. 4. Thereby, the heat generated by the control board 42b is released to the first space 39a via the radiator 58c. Thus, even the control board 42b generating a large amount of heat, can be efficiently cooled by the air flow containing oil mist through the radiator 58c. Further, by exposing the radiator 58c to the first space 39a such that the air flow containing oil mist will not enter the slot 36b, it is possible to cool the control board 42b while suppressing the influence of oil mist.

In the present embodiment, it is also possible to flow air in the direction opposite to the arrows in FIGS. 3 and 4. That is, air flow can be generated inside the first space 39a from the fans 28 on the upstream side toward the vent hole 60 on the downstream side. Also in this case, the aforementioned same effect can be obtained. Further, in the present embodiment, even if the housing 22 and the fan unit 30 are apart from each other, the above effect can be easily obtained as long as the air flow can pass through the first space 39a as the fans 28 are driven.

Technical Idea Obtained from Embodiment

Technical ideas that can be grasped from the above embodiment will be described below.

The cooling structure (10) includes the housing (22), and the fan (28) configured to cool the interior of the housing (22) by generating air flow inside the housing (22), the cooling structure including: the partition (38) provided in the housing (22) and configured to divide the interior of the housing (22) into the first space (39a) and the second space (39b), wherein the air flow containing oil mist is taken in from the outside and passed through the first space (39a), by driving the fan (28).

As a result, it is possible to efficiently cool the electronic components (42a, 42b) while suppressing the influence of oil mist.

The second space (39b) is enclosed by the partition (38) in the housing (22) so as not to come into contact with the oil mist, the first electronic component (42a) is arranged in the first space (39a), and the second electronic component (42b) different from the first electronic component (42a) is arranged in the second space (39b).

As a result, an electronic component that is not easily affected by oil mist is disposed in the first space (39a) as the first electronic component (42a), whereas an electronic component that is susceptible to oil mist can be disposed in the second space (39b) as the second electronic component (42b). That is, the second electronic component (42b) which does not need active cooling by the air flow including oil mist is enclosed by the partition (38) so as not to be directly exposed to the oil mist. As a result, it is possible to efficiently cool the electronic components (42a, 42b) while limiting the influence of oil mist.

The cooling structure (10) further includes the radiator (58c) disposed inside the first space (39a) so as to contact the air flow and configured to radiate heat from the second electronic component (42b).

Thereby, it is possible to exclude the influence of the oil mist and efficiently cool the second electronic component (42b) which is susceptible to the oil mist and generates a large amount of heat.

The cooling structure (10) further includes the radiator (58a, 58c) disposed inside the first space (39a) so as to contact the air flow.

As a result, heat generated from each of the electronic components (42a, 42b) is released in the first space (39a) via the radiator (58a, 58b), so that the electronic components (42a, 42b) can be efficiently cooled.

The housing (22) is arranged on the back face (16) of the display device (14), and the partition (38) is formed inside the housing (22) so that air flow flows inside the first space (39a) in the direction along the back face (16) of the display device (14).

Thereby, it is possible to easily form the first space (39a) inside the housing (22).

The first electronic component (42a) and the second electronic component (42b) are control boards configured to control the display device (14), the slots (36a, 36b) accommodating the control boards (42a, 42b) are provided in the housing (22) in the direction along the back face (16), and the slots (36a, 36b) form part of the partition (38).

This arrangement enables the control boards (42a, 42b) to be inserted into and removed from the slots (36a, 36b) without interfering with the display device (14). Further, by utilizing the slots (36a, 36b) as a part of the partition (38), it is possible to easily form the first space (39a) and the second space (39b).

The fan (28) is arranged on the downstream side of the air flow.

This makes it possible to create an efficient air flow into the first space (39a).

The housing (22) whose interior is cooled by air flow generated by the fan (28) includes the partition (38) provided in the housing (22) and configured to divide the interior of the housing (22) into the first space (39a) and the second space (39b), wherein the air flow containing oil mist is taken in from the outside and passed through the first space (39a), by driving the fan (28).

As a result, it is possible to efficiently cool the electronic components (42a, 42b) while suppressing the influence of oil mist.

The present invention is not limited to the embodiments described above, and it goes without saying that the embodiments can be freely modified within a range that does not deviate from the essence and gist of the present invention as set forth in the appended claims.

What is claimed is:

1. A cooling structure including a housing, and a fan configured to cool interior of the housing by generating air flow inside the housing, the cooling structure comprising:
   a partition provided in the housing and configured to divide the interior of the housing into a first space and a second space;
   a first electronic component is arranged in the first space; and
   a second electronic component different from the first electronic component is arranged in the second space;
   wherein the air flow containing oil mist is taken in from outside and passed through the first space, by driving the fan,
   wherein the second space is enclosed by the partition in the housing so as not to come into contact with the oil mist,
   wherein the housing is arranged on a back face of a display device, and the partition is formed inside the housing so that air flow flows inside the first space in a direction along the back face of the display device,
   wherein heat generated from the second electronic component is radiated into the first space via the partition,
   wherein the first electronic component and the second electronic component are control boards configured to control the display device;
   slots accommodating the control boards are provided in the housing in a direction along the back face; and
   the slots form part of the partition.

2. The cooling structure according to claim 1, further comprising a radiator disposed inside the first space so as to contact the air flow and configured to radiate heat from the second electronic component.

3. The cooling structure according to claim 1, further comprising a radiator disposed inside the first space so as to contact the air flow.

4. The cooling structure according to claim 1, wherein the fan is arranged on a downstream side of the air flow.

5. A housing whose interior is cooled by air flow generated by a fan, comprising:
   a partition provided in the housing and configured to divide the interior of the housing into a first space and a second space;
   a first electronic component is arranged in the first space; and
   a second electronic component different from the first electronic component is arranged in the second space;
   wherein the air flow containing oil mist is taken in from outside and passed through the first space, by driving the fan,
   wherein the second space is enclosed by the partition in the housing so as not to come into contact with the oil mist,
   wherein the housing is arranged on a back face of a display device, and the partition is formed inside the housing so that air flow flows inside the first space in a direction along the back face of the display device,
   wherein heat generated from the second electronic component is radiated into the first space via the partition,
   wherein the first electronic component and the second electronic component are control boards configured to control the display device;
   slots accommodating the control boards are provided in the housing in a direction along the back face; and
   the slots form part of the partition.

* * * * *